(12) United States Patent
Kim et al.

(10) Patent No.: US 8,344,400 B2
(45) Date of Patent: Jan. 1, 2013

(54) LIGHT EMITTING DEVICE PACKAGE

(75) Inventors: Choong Youl Kim, Gwangju (KR);
Hyeong Seok Im, Gwangju (KR); Joong In An, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 202 days.

(21) Appl. No.: 12/675,699

(22) PCT Filed: Aug. 26, 2008

(86) PCT No.: PCT/KR2008/004999
§ 371 (c)(1),
(2), (4) Date: Feb. 26, 2010

(87) PCT Pub. No.: WO2009/028861
PCT Pub. Date: Mar. 5, 2009

(65) Prior Publication Data
US 2010/0237370 A1    Sep. 23, 2010

(30) Foreign Application Priority Data
Aug. 31, 2007 (KR) .......... 10-2007-0088287
Sep. 10, 2007 (KR) .......... 10-2007-0091807

(51) Int. Cl.
*H01L 33/50*  (2010.01)
(52) U.S. Cl. ....... 257/98; 257/99; 257/79; 257/E33.061; 313/501; 313/503

(58) Field of Classification Search .................. 257/98, 257/E33.061, E33.056, 99, 79; 313/501, 313/503
See application file for complete search history.

(56) References Cited

U.S. PATENT DOCUMENTS

| | | | |
|---|---|---|---|
| 6,867,542 B1 * | 3/2005 | Sun et al. | 313/501 |
| 6,917,057 B2 | 7/2005 | Stokes et al. | |
| 7,023,019 B2 | 4/2006 | Maeda et al. | |
| 2006/0071591 A1 * | 4/2006 | Takezawa et al. | 313/501 |
| 2009/0039762 A1 | 2/2009 | Park et al. | |

FOREIGN PATENT DOCUMENTS

| | | |
|---|---|---|
| CN | 2586251 Y | 11/2003 |
| JP | 2006-261554 A | 9/2006 |
| KR | 10-2005-0071780 A | 7/2005 |
| WO | WO 2005/067068 A1 | 7/2005 |
| WO | WO 2005067068 A1 * | 7/2005 |

* cited by examiner

*Primary Examiner* — Cuong Q Nguyen
*Assistant Examiner* — Cathy N Lam
(74) *Attorney, Agent, or Firm* — Birch, Stewart, Kolasch & Birch, LLP

(57) ABSTRACT

Embodiments relate to a light emitting device package. The light emitting device package comprises: a body comprising a multilayer cavity; a light emitting device in the cavity; a first phosphor layer sealing the light emitting device and comprising a first phosphor; and a second phosphor layer comprising a second phosphor on the first phosphor layer, the second phosphor and the first phosphor having a difference in the specific gravity.

19 Claims, 2 Drawing Sheets

[Fig. 1]
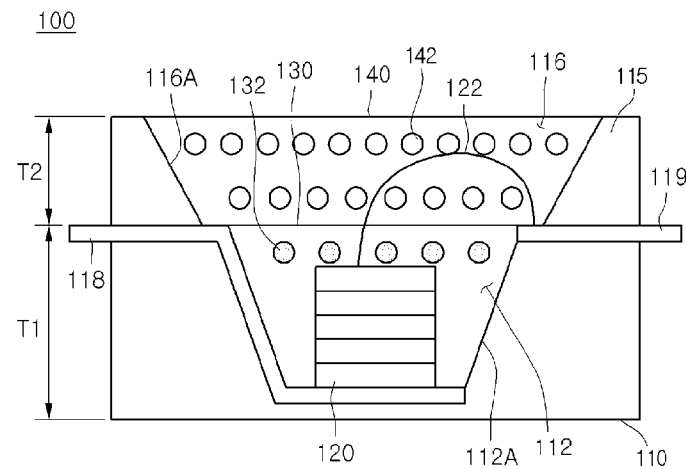
[Fig. 2]
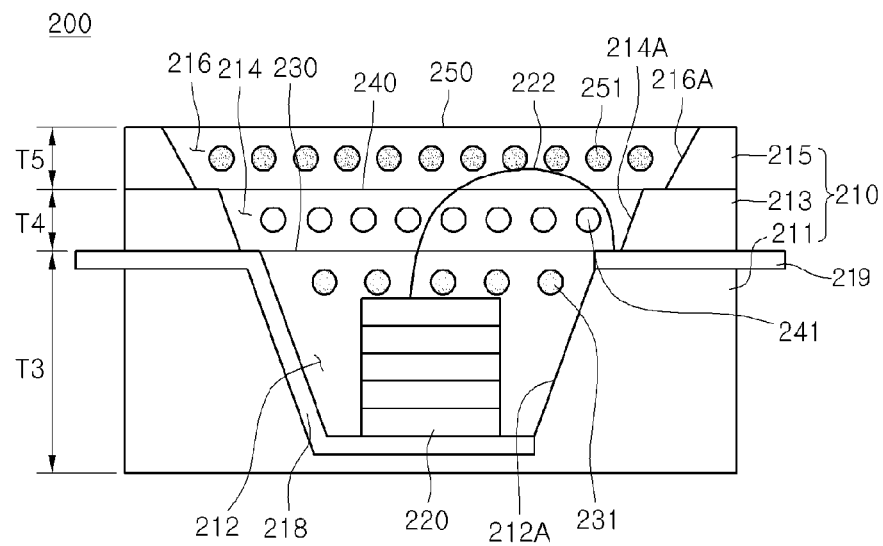
[Fig. 3]
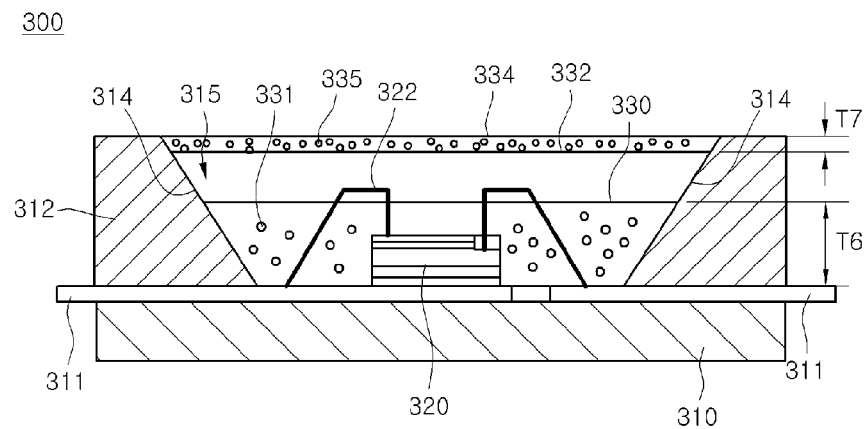

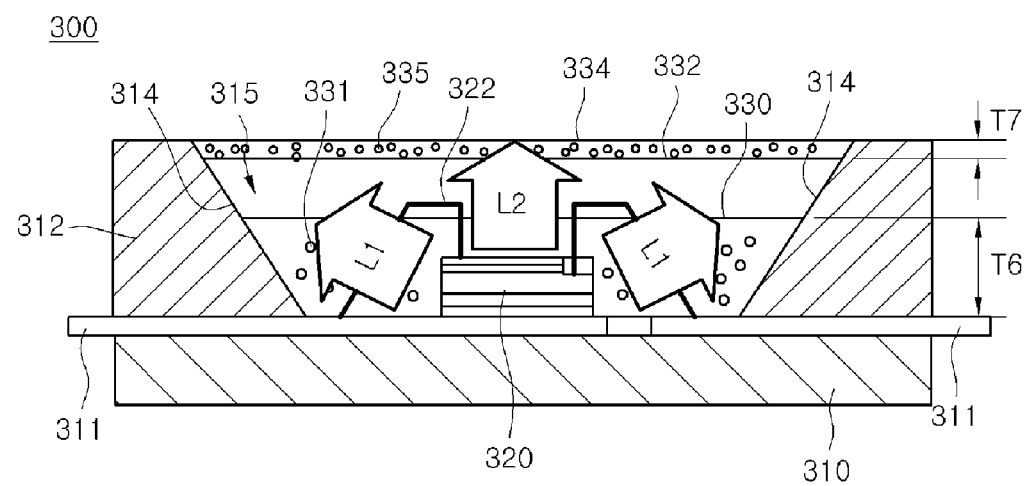
[Fig. 4]

LIGHT EMITTING DEVICE PACKAGE

TECHNICAL FIELD

Embodiments relate to a light emitting device package.

BACKGROUND ART

A light emitting diode (LED) can display various colors by configuring a light emitting source using a compound semi-conductor material such as GaAs group, AlGaAs group, GaN group, InGaN group and InGaAlP group.

Characteristics of an LED may be determined by the material of a compound semi-conductor, color and luminance, range of luminance intensity and the like. The LED is packaged and is being applied to various fields, such as an on/off display displaying colors, an alphanumeric display, an image display and the like.

DISCLOSURE OF INVENTION

Technical Problem

Embodiments provide a light emitting device package that can form phosphor layers of different colors in a cavity.

Embodiments provide a light emitting device package that can arrange different kinds of phosphors on a light emitting device.

Embodiments provide a light emitting device package in which a phosphor may be dispersed at a central region and a side region of cavity to emit an uniform white light.

Technical Solution

An embodiment provides a light emitting device package comprising: a body comprising a multilayer cavity; a light emitting device in the cavity; a first phosphor layer sealing the light emitting device and comprising a first phosphor; and a second phosphor layer comprising a second phosphor on the first phosphor layer, the second phosphor and the first phosphor having a difference in the specific gravity.

An embodiment provides a light emitting device package comprising: a body comprising a cavity; a light emitting device in the cavity; a plurality of lead patterns electrically connected the light emitting device; a first phosphor layer sealing the light emitting device and comprising a first phosphor in a neighborhood of the light emitting device; and a second phosphor layer comprising a second phosphor on the first phosphor layer, the second phosphor and the first phosphor having a difference in the specific gravity.

Advantageous Effects

Embodiments can improve the white chromatic uniformity.

Embodiments can improve the reliability of a white light emitting device package.

BRIEF DESCRIPTION OF THE DRAWINGS

FIG. 1 is a side sectional view of a light emitting device package according to a first embodiment.

FIG. 2 is a side sectional view of a light emitting device package according to a second embodiment.

FIG. 3 is a side sectional view of a light emitting device package according to a third embodiment.

FIG. 4 is a schematic view illustrating distribution of light emitted from the light emitting device package of FIG. 3.

BEST MODE FOR CARRYING OUT THE INVENTION

Hereinafter, embodiments will be described in detail with reference to the accompanying drawings.

FIG. 1 is a side sectional view of a light emitting device package according to a first embodiment.

Referring to FIG. 1, the light emitting device package 100 comprises a body 110, a plurality of lead patterns 118, 119, a light emitting device 120, a first phosphor layer 130, and a second phosphor layer 140.

The body 110 may be formed of resin material, such as PPA (Poly phthal amide), PC thermal plastic resin, insulator or the like. An upper layer section 115 is formed at an upper side of the body 110. The upper layer section 115 may be injection-molded integrally with the body 110, or attached separately from the body 110.

The body 110 has a thickness T1 ranging from 60 mm to 140 mm, and the upper layer section 115 has a thickness T2 ranging from 20 mm to 100 mm. That is, the upper layer section 115 and the body 110 have a thickness difference of at least 20 mm, and the thickness difference may be varied with the size of phosphor.

The body 110 has first and second cavities 112 and 116 of a multilayer structure formed therein. The first cavity 112 corresponds to a first layer region, and the second cavity 116 corresponds to a second layer region on the first layer region. Side surfaces 112A and 116A of the first and second cavities 112 and 116 are declined. A reflective material layer or a reflective sheet may be formed on the side surfaces 112A and 116A of the first and second cavities 112 and 116.

Each of the plurality of lead patterns 118, 119 has one end exposed to the first and second cavities 112, 116 and the other end penetrating the body 110 and exposed to an outside. The lead patterns 118, 119 are inserted in a structure penetrating the body 110, and then are arranged in the first and second cavities 112, 116 by an injection molding. Of the plurality of lead patterns 118, 119, the first lead pattern 118 may extend to a bottom surface of the first cavity 112. However, the present invention is not limited to the above shape of these lead patterns.

The light emitting device 120 is disposed in the first cavity 112, and is electrically connected with the first and second lead patterns 118 and 119. The light emitting device 120 is connected with the first lead pattern 118 by a conductive adhesive and is connected with the second lead pattern 119 by a wire 122. The light emitting device 120 may be mounted in a flip manner. However, the present invention is not limited thereto.

The light emitting device 120 may use at least one blue LED chip. However, the present invention is not limited thereto.

The first phosphor layer 130 is formed in the region of the first cavity 112 and comprises a first phosphor 132. The second phosphor layer 140 is formed in the region of the second cavity 116, and comprises a second phosphor 142.

The first and second phosphor layers 130 and 140 are mixtures of transparent resin material, such as epoxy, silicon or the like, and the phosphors 132, 142. The first phosphor layer 130 may be formed at a thickness to cover the light emitting device 120, and the second phosphor layer 140 may be formed within the thickness range T2 of the upper layer section 119 of the body 110, for example, in a thickness range of 20~100 mm.

The second phosphor layer 140 is formed on the first phosphor layer 130. The second phosphor layer 140 may be molded after or before the first phosphor layer 130 is cured. A lens (ex: convex lens) may be attached on the second phosphor layer 140.

The first phosphor 132 and the second phosphor 142 are phosphors emitting lights having different spectra. One of the first phosphor 132 and the second phosphor 142 may be a green phosphor and the other is a red phosphor. Herein, the red phosphor may use (Sr,Ca)—Ge—S:Eu group, and the green phosphor may use $(Ba,Sr,Ca)_2SiO_4$:Eu or $SrGa_2S_4$:Eu group. However, the present invention is not limited thereto.

Also, when the first phosphor 132 of the first phosphor layer 130, for example, a green phosphor, which has a lower specific gravity than the resin material, is added, the first phosphor 132 is cured in a floating state in the first phosphor layer 130. At this time, most of the first phosphor 132 of the first phosphor layer 130 is arranged on the light emitting device 120. In this case, a phosphor emitting light having a different spectrum may be disposed on the light emitting device 120.

Alternatively, a nano-sized filler (not shown) may be added to the first phosphor layer 130. The filler functions to float the first phosphor 132.

Also, when the second phosphor 142 of the second phosphor layer 140, for example, a red phosphor, which has a higher specific gravity than the resin material, is added, the second phosphor 142 is cured in a precipitated state in the second phosphor layer 140. The specific gravity of the phosphors may be determined by the specific gravity of the resin material, and a difference in the specific gravity of the phosphors may be varied with materials constituting the phosphors.

The first phosphor 132 and the second phosphor 142 arranged on the light emitting device 120 can convert the light emitted from the light emitting device 120 into an excited light having a uniform intensity.

A surface of at least one of the first phosphor layer 130 and the second phosphor layer 140 may be formed in at least one of a concave lens shape, a flat shape, and convex lens shape. For example, the surface of the first phosphor layer 130 may be formed in a flat shape or a convex lens shape, and the surface of the second phosphor layer 140 may be formed in a convex lens shape or a concave lens shape.

The light emitting device package 100 emits white light. The light emitting device 120 may be, for example, a blue LED chip, the first phosphor 132 may be, for example, a red phosphor, and the second phosphor 142 may be, for example, a green phosphor. The light emitting device 120 emits blue light, the first phosphor 132 of the first phosphor layer 130 absorbs some of the blue light to emit red light, and the second phosphor 142 of the second phosphor layer 140 absorbs some of the blue light to emit green light.

The light emitting device package 100 emits white light, which is a mixed light of the blue light, the green light and the red light. As another example, a green phosphor may be added in the first phosphor layer 130 and a red phosphor may be added in the second phosphor layer 140.

Also, the first phosphor layer 130 or the second phosphor layer 140 may contain two kinds of phosphors. For example, the first phosphor 132 of the first phosphor layer 130 may be a red phosphor and the second phosphor 142 of the second phosphor layer 140 may contain a blue phosphor and a green phosphor. In this case, when the light emitting device 120 is an UV (Ultra violet) LED chip, the light emitting device package 100 can emit white light made by mixing the red light, blue light and green light emitted from the phosphors.

The light emitting device package 100 can improve the white chromatic uniformity by uniformly distributing the first and second phosphors 132, 142 emitting lights having different colors on the light emitting device 120.

FIG. 2 is a side sectional view of a light emitting device package according to a second embodiment. In the description of the second embodiment, the description on the same elements as those of the first embodiment will be omitted.

Referring to FIG. 2, the light emitting device package 200 comprises a multi-layered body 210 having a plurality of layer sections 211, 213, 215, cavities 212, 214, 216, a plurality of lead patterns 218, 219, a light emitting device 220, a first phosphor layer 230, a second phosphor layer 240, and a third phosphor layer 250.

The body 210 is formed in a stack structure comprised of the plurality of layer sections 211, 213, 215. The plurality of layer sections 211, 213, 215 may be integrally injection-molded or separately attached. The first layer section 211 of the body 210 may have a thickness T3 ranging from 60 mm to 140 mm, the second layer section 213 may have a thickness T4 ranging from 20 mm to 100 m, and the third layer section 215 may have a thickness T5 ranging from 20 mm to 100 mm. The second layer section 213 and the third layer section 215 is formed at a thickness of at least 20 mm, and the thicknesses of the first layer section 213 and the second layer section 215 may be varied with the size of the phosphors.

The cavities 212, 214, 216 formed in a multi-layer structure in the body 210 communicate with one another. The first cavity 212 corresponds to the lowest layer region, the second cavity 214 corresponds to a middle layer region, and the third cavity 216 corresponds to the uppermost layer region.

Side surfaces 212A, 214A, and 216A of the cavities 212, 214, 216 are declined. A reflective material layer may be formed on the side surfaces 212A, 214A, and 216A of the cavities 212, 214, 216. The side surfaces 212A, 214A, 216A may be formed at the same slope angle or different angles.

The plurality of lead patterns 218, 219 may penetrate between the first layer section 211 of the body 210 and the second layer section 213, and the first lead pattern 218 extends to a bottom surface of the first cavity 212.

The light emitting device 220 may be electrically connected with the plurality of lead patterns 218, 219. The light emitting device 220 is connected with the first lead pattern 218 by a conductive adhesive and is connected with the second lead pattern 219 by a wire 222.

The light emitting device 220 may be realized by an UV LED chip. However, the present invention is not limited thereto.

The first phosphor layer 230 comprises a first phosphor 231, and is formed in the first cavity 212. The second phosphor layer 240 comprises a second phosphor 241 and is formed in the second cavity 214. The third phosphor layer 250 comprises a third phosphor 251 and is formed in the third cavity 216.

The first phosphor layer 230 may be formed at a thickness to cover the light emitting device 220, the second phosphor layer 240 may be formed within the thickness range T4 of the second layer section 213 of the body 210, for example, in a thickness range of 20~100 mm, and the third phosphor layer 250 may be formed within the thickness range T5 of the third layer section 215 of the body 210, for example, in a thickness range of 20~100 mm.

The second phosphor layer 240 may be molded after the first phosphor layer 230 is cured or before the first phosphor layer 230 is completely cured.

Surface of the first to third phosphor layers 230, 240, 250 may be formed in at least one of a concave lens shape, a convex lens shape, and a flat shape. For example, the surfaces of the first phosphor 230 and the second phosphor 240 may be formed in a convex lens shape, and the surface of the third phosphor 250 may be formed in a flat shape or a convex lens shape.

The light emitting device package 200 emits white light. For example, when the light emitting device 220 is an UV LED chip, the first phosphor 231, the second phosphor 241 and the third phosphor 251 may used different phosphors, for example, a red phosphor, a green phosphor and a blue phosphor. For example, the first phosphor 231 may be a red phosphor, the second phosphor 241 may be a green phosphor and the third phosphor 251 may be a blue phosphor. The types of the phosphors may be changed without being limited to the above example. The red phosphor may be realized by (Sr, Ca)—Ge—S:Eu group, the green phosphor may be realized by $(Ba,Sr,Ca)_2SiO_4$:Eu or $SrGa_2S_4$:Eu group, and the blue phosphor may be realized by ZnS:Ag, Dy, Br group. However, the present invention is not limited thereto.

The first phosphor 231 of the first phosphor layer 230 may use a phosphor having a lower specific gravity than the resin material. At this time, the first phosphor 231 is cured in a floating state in the first phosphor layer 230 and then disposed on the light emitting device 220.

Alternatively, a nano-sized filler (not shown) may be added to the first phosphor layer 230. The filler functions to float the first phosphor 231.

The light emitting device package 200 can emit white light by arranging the phosphors 231, 241, 251 having different colors and thereon and converting the light emitted from the light emitting device 220 to white light using the phosphors 231, 241, 251. Accordingly, the light emitting device package 200 can improve the white chromatic uniformity.

FIG. 3 is a side sectional view of a light emitting device package according to a third embodiment, and FIG. 4 is a schematic view illustrating distribution of light emitted from the light emitting device package of FIG. 3. In the description of the third embodiment, the description on the same elements as those of the first embodiment will be omitted.

Referring to FIG. 3, the light emitting device package 300 comprises a lower body 310, a lead pattern 311, an upper body 312, a cavity 315, a light emitting device 320, a first phosphor layer 330, a transparent resin layer 332, and a second phosphor layer 334.

The lead pattern 311 is formed in plurality on the lower body 310. The plurality of lead patterns 311 are exposed to an outside from the lower body 310, and used as an electrode.

The upper body 312 is attached on the lower body 310, and an inner opening of the upper body 312 functions as the cavity 315 of the bodies 310, 312.

Side surfaces 314 of the cavity 315 may be formed declined outward with respect to a bottom surface of the cavity 315 to reflect light in a light output direction. A reflective material layer or a reflective sheet may be attached on the side surfaces 314.

The light emitting device 320 comprises at least one blue LED chip, and may be electrically connected to the lead patterns 311 in a flip manner or by a wire 322 according to the type of the LED chip.

In the cavity 315, the first phosphor layer 330, a transparent resin layer 332 and the second phosphor layer 334 are stacked. After the light emitting device 320 is mounted on the plurality of lead patterns 311, the first phosphor layer 330 is molded and cured. After the first phosphor layer 330 is cured, the transparent resin layer 332 is molded on the first phosphor layer 330 and cured. After the transparent resin layer 332 is cured, the second phosphor layer 334 is molded on the transparent resin layer 332 and cured. Herein, the cured states of the respective layers 330, 332, 334 correspond to semi-curing state or full-curing state of the resin material.

The first phosphor layer 330 may be formed at a thickness T6 ranging from about 100 mm to 150 mm from the bottom surface of the cavity 315. The first phosphor layer 330 may be molded to the thickness T6 corresponding to a capacitance less than half an inner volume of the cavity 315. The thickness T6 of the first phosphor layer 330 allows the light emitting device 320 to be completely sealed. When the wire 322 is used, the wire 322 may be partially sealed.

The first phosphor layer 330 comprises a resin material such as silicon or epoxy, and the first phosphor 331 added in the resin material. The first phosphor 331 is a yellow phosphor formed of at least one selected from the group consisting of oxides, nitrides and sulfides.

Herein, the specific gravity of the first phosphor 331 may be higher than that of the resin material. For example, when the resin material has a specific gravity of 1~2, the specific gravity of the first phosphor may be more than 3. If the specific gravity of the first phosphor 331 in the first phosphor layer 330 is higher than that of the resin material, most of the first phosphor 331 is precipitated to a lower portion of the first phosphor layer 331 and disposed in a side direction of the light emitting device 320.

The transparent resin layer 332 is formed on the first phosphor layer 330 of the cavity 315. The transparent resin layer 332 is made of a resin material such as silicon or epoxy, and may be formed of the same material as the resin material of the first phosphor layer 330.

The second phosphor layer 334 is formed on the transparent resin layer 332. The second phosphor layer 334 may be formed at a predetermined thickness T2, for example, about 30~100 mm from a top surface of the transparent resin layer 332. The second phosphor layer 334 is made of a resin material such as silicon or epoxy, and may be formed of the same material as the transparent resin layer 332. The second phosphor 335 is added in the second phosphor layer 334. The second phosphor 335 is a yellow phosphor formed of at least one selected from the group consisting of oxides, nitrides and sulfides.

The particle size of the second phosphor 335 may be different than that of the first phosphor 331. For example, the particle size of the second phosphor 335 may be less than $\frac{1}{10}$ of the particle size of the first phosphor 331. Since the particle size of the second phosphor 335 is small, the second phosphor 335 is floated upward in the second phosphor layer 334.

Alternatively, a nano-sized filler (not shown) may be added in the second phosphor layer 334. The filler functions to float the second phosphor 334. When the filler is used, it is unnecessary to consider the particle size, specific gravity and composition of the second phosphor 335 of the second phosphor layer 334 and the first phosphor 331 of the first phosphor layer 330.

A convex or concave lens may be formed on the second phosphor layer 334. Also, a surface of at least one of the first phosphor layer 330, the transparent resin layer 332 and the second phosphor layer 334 may be formed in at least one of a concave lens shape, a flat shape, and convex lens shape.

In the light emitting device package 300, the first and second phosphor layers 330, 334, which are relatively thick, are disposed in a side direction, and the first and second phosphor layers 330, 334, which are relatively thin, are disposed in an upward direction.

In the side direction of the light emitting device 320, the first and second phosphor layers 330, 334 contribute to the electro-optic conversion operation, and in the upward direction, the second phosphor layer 334 contribute to the electro-optic conversion operation.

Referring to FIG. 4, a blue light generated from the light emitting device 320 is emitted to entire regions. Some of the blue light emitted in the side direction passes through the first phosphor layer 330 and the second phosphor layer 334. At this time, in the side region of the cavity 315, the blue light of the light emitting device 320 is mixed with the yellow light of the first and second phosphors 331, 335, so that a yellowish white light L1 is emitted. That is, since the first phosphor layer 330 and the second phosphor layer 334 are used as a yellow phosphor layer in the side direction of the light emitting device 320, the mixed lights can be converted to a yellowish white light.

Some of the blue light emitted in the upward direction of the light emitting device 320 passes through the second phosphor layer 334. At this time, at a central region of the cavity 315, the blue light of the light emitting device 320 is mixed with the yellow light of the second phosphor 335, so that a bluewish white light L2 is emitted. That is, since the second phosphor layer 334 is used as a yellow phosphor layer in the upward direction of the light emitting device 320, the mixed lights can be converted to a bluewish white light.

The bluewish white light L2 is emitted from the central region of the cavity 315 and the yellowish white light L1 is emitted from the central peripheral regions of the cavity 315. Thus, at the central region of the cavity 315, the second phosphor layer 334, which is relatively thin, is disposed, and at the peripheral regions of the light emitting device 320, the first and second phosphors 331, 335 are dispersed in a uniform distribution. Accordingly, the light emitting device package 300 can emit white light uniformly.

The embodiments are exemplary embodiments. Technical features and structural features of each embodiment can be applied to features of another embodiment and are not limited only to each embodiment. Also, a method of manufacturing a light emitting device package can be embodied by those skilled in the art.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments relate to LED packages, and can be applied to an on/off display displaying colors, an alphanumeric display, an image display and the like.

The invention claimed is:
1. A light emitting device package comprising:
a body including a multilayer cavity;
a light emitting device in the cavity;
a first phosphor layer including a first phosphor and sealing the light emitting device; and
a second phosphor layer including a second phosphor having a high specific gravity on the first phosphor layer in the cavity,
wherein a specific gravity of the first phosphor is lower than a material constituting the first phosphor layer.
2. The light emitting device package of claim 1, wherein the first phosphor emits light having a different spectrum than the second phosphor.
3. The light emitting device package of claim 1, wherein the first phosphor layer or the second phosphor layer comprises at least two kinds of phosphors.
4. The light emitting device package of claim 1, wherein the light emitting device is a blue LED chip, the first phosphor layer comprises a red phosphor, and the second phosphor layer comprises a green phosphor.
5. The light emitting device package of claim 1, wherein the first phosphor is substantially disposed on the light emitting device.
6. The light emitting device package of claim 3, wherein the light emitting device is a UV LED chip, one of the first and second phosphor layers comprises a red phosphor, and the other of the first and second phosphor layers comprises a blue phosphor and a green phosphor.
7. The light emitting device package of claim 1, wherein the body includes a first body portion and a second body portion on the first body portion.
8. The light emitting device package of claim 7, further comprising:
lead patterns between the first and second body portions.
9. The light emitting device package of claim 8, wherein the lead pattern is disposed at a position higher than that of a top surface of the light emitting device.
10. The light emitting device package of claim 8, wherein the lead pattern is disposed at substantially the same position as that of a top surface of the first phosphor layer.
11. A light emitting device package comprising:
a body including a cavity;
a light emitting device in the cavity;
a first phosphor layer sealing the light emitting device and including a first phosphor on the light emitting device; and
a second phosphor layer including a second phosphor on the first phosphor layer, the second phosphor and the first phosphor having a difference in the specific gravity,
wherein a specific gravity of the first phosphor is lower than a material constituting the first phosphor layer.
12. The light emitting device package of claim 11, wherein the first phosphor has a specific gravity of more than 3.
13. The light emitting device package of claim 11, wherein the second phosphor has a particle size, which is less than 1/10 of a particle size of the first phosphor.
14. The light emitting device package of claim 11, wherein at least one of the first phosphor layer and the second phosphor layer comprises a nano-scaled filler.
15. The light emitting device package of claim 11, wherein the body includes a first body portion and a second body portion on the first body portion.
16. The light emitting device package of claim 15, further comprising:
lead patterns between the first and second body portions.
17. The light emitting device package of claim 16, wherein the lead pattern is disposed at a position higher than that of a top surface of the light emitting device.
18. The light emitting device package of claim 16, wherein the lead pattern is disposed at substantially the same position as that of a top surface of the first phosphor layer.
19. The light emitting device package of claim 11, wherein the first phosphor is substantially disposed on the light emitting device.

* * * * *